(12) United States Patent
Okumura (10) Patent No.: US 9,048,612 B2
(45) Date of Patent: Jun. 2, 2015

(54) LASER LIGHT SOURCE MODULE

(75) Inventor: Fujio Okumura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 414 days.

(21) Appl. No.: 13/641,742

(22) PCT Filed: Jun. 3, 2011

(86) PCT No.: PCT/JP2011/062754
§ 371 (c)(1),
(2), (4) Date: Oct. 17, 2012

(87) PCT Pub. No.: WO2012/011323
PCT Pub. Date: Jan. 26, 2012

(65) Prior Publication Data
US 2013/0038247 A1    Feb. 14, 2013

(30) Foreign Application Priority Data

Jul. 23, 2010  (JP) .................. 2010-165991

(51) Int. Cl.
| | |
|---|---|
| H05B 37/02 | (2006.01) |
| H05B 39/06 | (2006.01) |
| H05B 41/04 | (2006.01) |
| H05B 41/18 | (2006.01) |
| H01S 5/022 | (2006.01) |
| G03B 21/20 | (2006.01) |
| H01S 5/042 | (2006.01) |

(52) U.S. Cl.
CPC ........ *H01S 5/02288* (2013.01); *G03B 21/2033* (2013.01); *G03B 21/2086* (2013.01); *H01S 5/042* (2013.01)

(58) Field of Classification Search
USPC .................. 315/362; 362/259, 553
See application file for complete search history.

(56) References Cited

U.S. PATENT DOCUMENTS 5,742,718 A  *  4/1998  Harman et al. ............... 385/53
7,837,091 B2 * 11/2010 Cook et al. .................. 235/375
7,907,643 B2 *  3/2011 Howe et al. .................. 372/8

(Continued)

FOREIGN PATENT DOCUMENTS

| CN | 101720472 A | 6/2010 |
| JP | 2007019476 A | 1/2007 |

(Continued)

OTHER PUBLICATIONS

The international search report for PCT/JP2011/062754 mailed on Sep. 6, 2011.

(Continued)

*Primary Examiner* — Adam Houston
(74) *Attorney, Agent, or Firm* — Sughrue Mion, PLLC (57) ABSTRACT

A laser light source module that does not emit laser light when taken out of a device or that does not emit laser light when the device is modified by removing a portion of the device is installed and used in a case and is provided with: a laser unit that includes a memory unit that stores a password and that operates when an input password that is entered matches a password stored in the memory unit; a password-setting mechanism that generates different data according to the state of the case; and a password-generating circuit that generates an input password that matches the password stored in the memory unit by means of data generated by means of the password-setting mechanism when the case is in a normal state.

3 Claims, 10 Drawing Sheets

(56) References Cited

U.S. PATENT DOCUMENTS

| | | |
|---|---|---|
| 8,114,068 B2 * | 2/2012 | Rheinwald et al. ............ 606/15 |
| 2005/0253538 A1 * | 11/2005 | Shah et al. .................... 315/362 |
| 2007/0103643 A1 * | 5/2007 | Takeda et al. ................... 353/30 |
| 2008/0170208 A1 * | 7/2008 | Kamijima ..................... 353/119 |
| 2009/0008232 A1 * | 1/2009 | Dold ............................. 200/401 |
| 2009/0174929 A1 * | 7/2009 | Egawa .......................... 359/328 |
| 2009/0202932 A1 * | 8/2009 | Argoitia et al. .......... 430/108.11 |
| 2010/0289627 A1 * | 11/2010 | McAllister et al. ........ 340/10.42 |
| 2013/0038247 A1 * | 2/2013 | Okumura ..................... 315/362 |
| 2013/0196530 A1 * | 8/2013 | Cheatham et al. ............ 439/357 |
| 2014/0230885 A1 * | 8/2014 | Fyson et al. .................. 136/251 |

FOREIGN PATENT DOCUMENTS

| | | |
|---|---|---|
| JP | 2007235517 A | 9/2007 |
| JP | 2008135508 A | 6/2008 |
| JP | 2008171657 A | 7/2008 |
| JP | 2009103776 A | 5/2009 |
| JP | 2009164443 A | 7/2009 |

OTHER PUBLICATIONS

Chinese Office Action for CN Application No. 201180027650.X issued on Mar. 14, 2014 with English Translation.

* cited by examiner

Fig.2 to power supply

LASER LIGHT SOURCE MODULE

TECHNICAL FIELD

The present invention relates to laser light source module that is used as a light source of, for example, a projector, laser scalpel, or laser processor and that is arranged in the case of a device, and more particularly relates to a laser light source module that uses a semiconductor element.

BACKGROUND ART

Laser light has a fixed wavelength, high tracking capability, and can efficiently obtain linearly polarized light and is consequently used in a variety of devices. In recent years, semiconductor lasers have been realized that supply visible light at high output, and the production of projectors having compact size and high luminance through the use of these semiconductor lasers has been proposed.

The laser light that is emitted from a laser light source has high energy per unit area, and a laser light source therefore poses a serious danger of accident if it is removed from various types of devices and put to uses for which it was not originally intended. As a result, various proposals have been made for preventing the removal of the laser light source from various devices in a state in which the laser light source would be able to emit laser light.

Patent Document 1 (Japanese Unexamined Patent Publication No. 2008-171657) discloses a light source module that includes: a light source part that supplies light, a support part that supports the light source part, a cover part that covers the light source part, wiring parts that connect the light source part and a current supply part that supplies current to the light source part, and a blade part that is arranged to pass through the cover part and a position on the support-part side of the wiring parts.

Patent Document 1 discloses that, due to the provision of the above-described configuration, when the cover part is removed to extract the light source part from the light source module, the blade part, which is arranged to pass through the cover part and a position on the support-part side of the wiring parts, cuts the wiring parts as the cover part is removed, and the power supply to the light source part is consequently cut off.

Patent Document 2 (Japanese Unexamined Patent Application Publication No. 2007-019476) discloses a device that includes: a laser light source part having a light oscillation part that oscillates light, a support part that supports the laser light source part, a securing part that secures the laser light source part to the support part, and a cut-off means whose movement is simultaneous with the movement of the securing part to release the secured state of the laser light source part when the laser light source part is removed from the support part and thus cuts off the current path that supplies current to the light oscillation part in the laser light source part.

Patent Document 2 discloses that, due to the provision of the above-described configuration, an attempt to release the laser light source part from its secured state in which it has been secured by the securing part with the intent of removing the laser light source part from support part such as a case causes the current path of the laser light source part to be cut off by the cutoff-means due to this action, and because the laser light source part therefore becomes incapable of reliably emitting light, removal of the laser light source part from, for example, a display device, with the intention of improperly using the laser light source part can be prevented in advance.

Patent Document 3 (Japanese Unexamined Patent Application Publication No. 2008-135508) discloses a device that includes: a light-emitting element that emits laser light, a support part that supports the light-emitting element, a substrate that is secured to the support part and that is electrically connected to the light-emitting element, wiring that is electrically connected to the light-emitting element and the support part and that supplies current, a cover part having at least a portion that is able to transmit light and that further covers the light-emitting element that is secured to the substrate, and a securing part that secures the substrate and the cover part; the bonding strength between the substrate and the cover part realized by the securing part being greater than the bonding strength between support part and the substrate.

Patent Document 3 discloses that, due to the provision of the above-described configuration, an attempt to remove the cover part that covers the light-emitting element for the purpose of removing the light-emitting element will cause the cover part to be detached from the support part together with the substrate because the bonding strength between the cover part and the substrate realized by the securing part is greater than the bonding strength between the substrate and the securing part, whereby the wiring that connects the light-emitting element to the substrate is cut off and the emission of laser light from the light-emitting element can be reliably prevented.

Patent Document 4 (Japanese Unexamined Patent Application Publication Number No. 2009-164443) discloses a device that includes: a light source unit that emits light, a wavelength conversion element that converts the wavelength of light that is emitted from the light source unit, a light source case that houses at least the light source part and wavelength conversion element, and a temperature-adjusting unit that adjusts the temperature of the wavelength conversion element, the temperature-adjusting unit being provided outside the light source case.

Patent Document 4 discloses that, due to the provision of the above-described configuration, extracting the main body that is provided with the light source case from the temperature-adjusting unit cuts off the conduction of heat between the temperature-adjusting unit and the wavelength conversion element, thereby halting temperature adjustment of the wavelength conversion element and decreasing the wavelength conversion efficiency in the wavelength conversion element. Decreasing the wavelength conversion efficiency decreases the emission of light from the main unit and thus sufficiently reduces the possibility of improper use or diversion to another use.

LITERATURE OF THE PRIOR ART

Patent Documents

Patent Document 1: Japanese Unexamined Patent Application Publication No. 2008-171657
Patent Document 2: Japanese Unexamined Patent Application Publication No. 2007-019476
Patent Document 3: Japanese Unexamined Patent Application Publication No. 2008-135508
Patent Document 4: Japanese Unexamined Patent Application Publication No. 2009-164443

SUMMARY OF THE INVENTION

Problem to be Solved by the Invention

In the devices described in Patent Documents 1 to 3, despite the separation of a laser device power supply and laser device that are provided in the device itself, laser light is still supplied if the laser device is driven by a power supply other than the power supply for the laser device.

In the device described in Patent Document 4, when the temperature-adjusting unit is separated from the main unit that is provided with a light source case, laser light is supplied in a state of decreased wavelength conversion efficiency. As described hereinabove, the high energy per unit area of laser light poses extreme danger to the human body, particularly when irradiated into the eyes, even in a state in which the wavelength conversion efficiency is decreased.

None of the devices described in Patent Documents 1 to 4 is able to deal with actions to convert the device such that the laser light can be used for purposes other than the originally intended purpose, such as removing a portion of the case of the device and causing laser light to be output when the device is in a state of actually being used.

The present invention has the object of realizing a laser light source module that will not supply laser light when it is taken out of the device or when conversion has been implemented in which a portion of the device is removed.

Means for Solving the Problem

The laser light source module of the present invention is a laser light source module that is used installed in a case and is provided with:

a laser unit that is provided with a memory unit that stores a password and that operates when an input password that is supplied as input matches with a password that was stored in the memory unit;

a password-setting mechanism that generates different data according to the state of the case; and a password-generating circuit that, when the case is in the normal state, generates by means of data that were generated by the password-setting mechanism an input password that matches the password that was stored in the memory unit.

Effect of the Invention

In the invention of the present application that is provided with the above-described configuration, a laser light source module can be realized in which the laser unit does not operate unless the case is in a normal state, whereby laser light is not supplied when the laser light source module has been taken out of the device, and further, laser light is not supplied when a conversion has been effected such that a portion of the device has been cut away.

BRIEF DESCRIPTION OF THE DRAWINGS

FIG. 5(a) shows the state before combining upper cover 401 and lower cover 402, FIG. 5(b) shows the state in which upper cover 401 and lower cover 402 are combined, and FIG. 5(c) shows the state when upper cover 401 has been opened after upper cover 401 and lower cover 402 have been combined.

FIG. 7(a) shows connection relations of terminals F-K that are set as passwords, FIG. 7(b) shows the internal wiring of upper cover 401 or lower cover 402 that realizes the connection relation shown in FIG. 7(a), and FIG. 7(c) shows a state in which upper cover 401 or lower cover 402 has been cut away.

BEST MODE FOR CARRYING OUT THE INVENTION

An exemplary embodiment of the present invention is next described with reference to the accompanying drawings.

Figure 1:
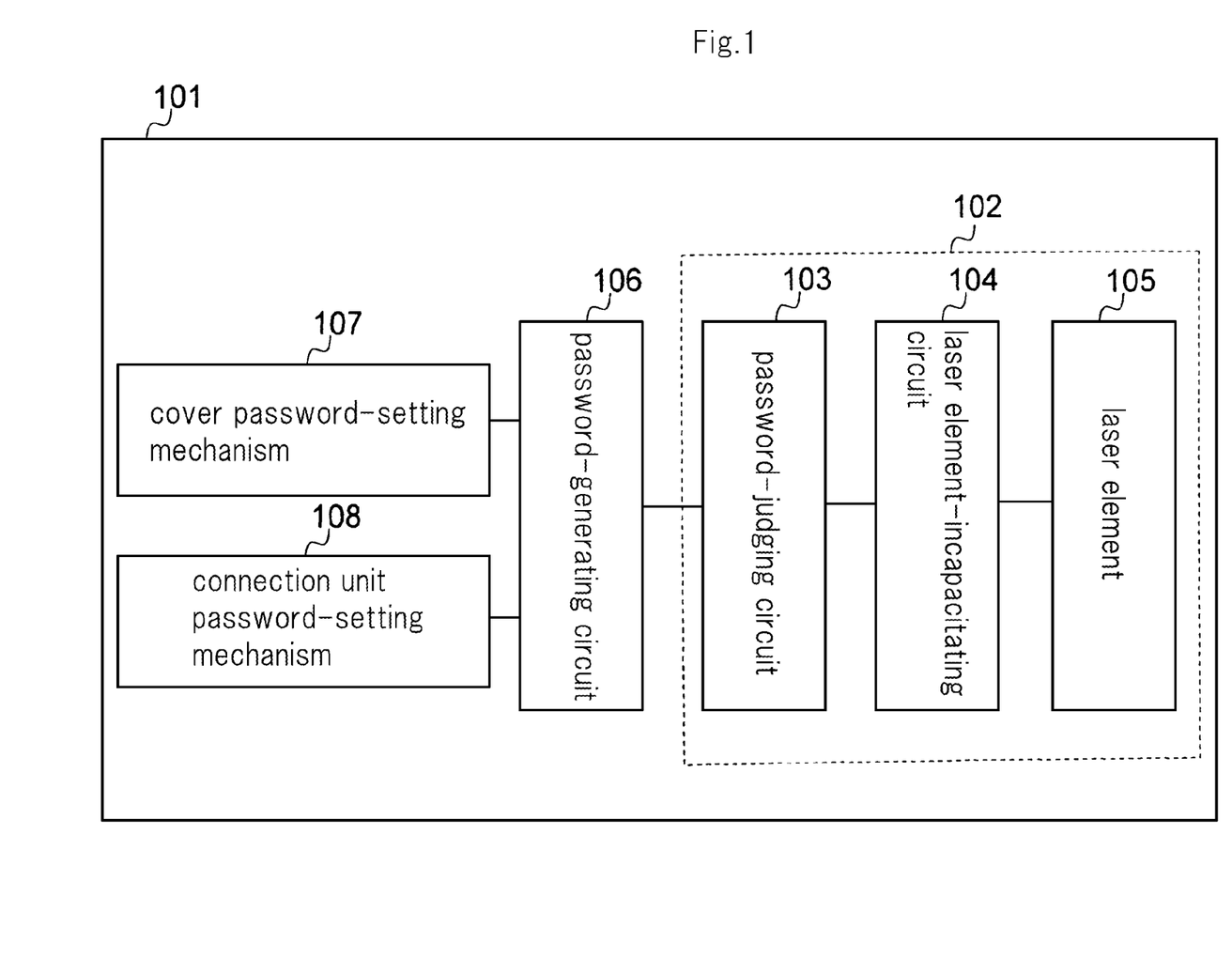
FIG. 1 is a block diagram showing the configuration of an exemplary embodiment of projector 101 in which the laser light source module according to the present invention is used as a light source.

FIG. 1 is a block diagram showing the configuration of an exemplary embodiment of projector 101 that uses the laser light source module according to the present invention as a light source. Because the configuration other than the light source in the present exemplary embodiment is the configuration of a typical projector, only the laser light source module is shown and figures and explanation for other parts are omitted.

The laser light source module is made up of: laser unit 102, password-generating circuit 106, cover password-setting mechanism 107, and connection unit password-setting mechanism 108. Laser unit 102 is made up of password-judging circuit 103, laser element-incapacitating circuit 104, and laser element 105.

Figure 2:
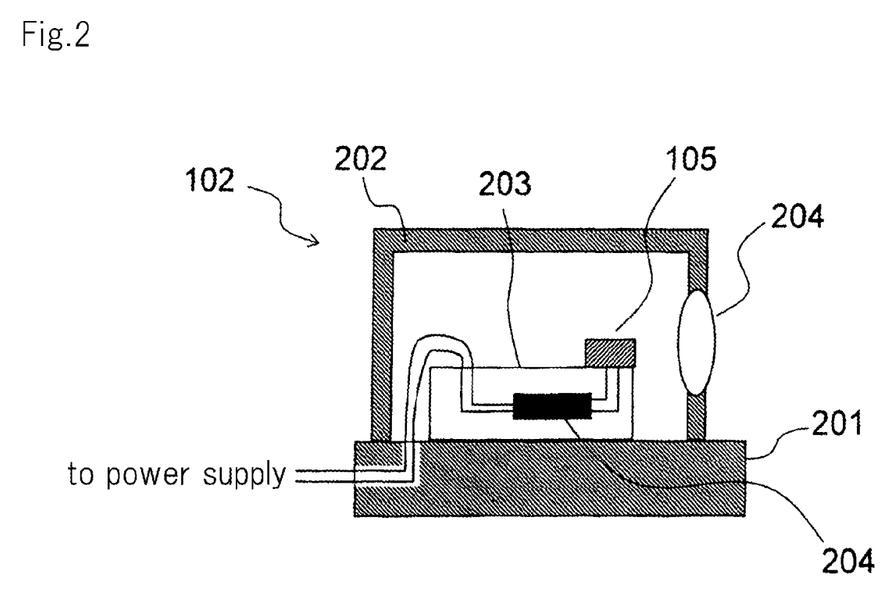
FIG. 2 is a sectional view showing the configuration of laser unit 102.

FIG. 2 is a sectional view showing the configuration of laser unit 102.

Laser unit 102 is made up of ceramic multilayer substrate 203 that is formed on substrate 201 and cover 202 that covers ceramic multilayer substrate 203. Circuit group 204 composed of password-judging circuit 103 and laser element-incapacitating circuit 104 are formed in ceramic multilayer substrate 203, and laser element 105 is mounted in a face-down state on the upper surface of circuit group 204.

Collimator lens 204 is provided at the position of cover 202 through which laser light emitted by laser element 105 passes. Cover 202 together with substrate 201 hermetically seals ceramic multilayer substrate 203.

Ceramic multilayer substrate 203 employs a material such as AlN that has a thermal expansion coefficient close to that of laser element 105. The use of a material having a thermal expansion coefficient close to that of laser element 105 for ceramic multilayer substrate 203 enables a fixed positional relation between ceramic multilayer substrate 203 and laser element 105 that does not depend on changes in temperature and enables a more stable laser output to be obtained.

Ceramic multilayer substrate 203 is hermetically sealed by substrate 201 and cover 202 as described above. If cover 202 is opened or damaged and ceramic multilayer substrate 203 or laser element 105 is removed, the adherence of dirt or a chemical reaction such as oxidation on ceramic multilayer substrate 203 or laser element 105 or a shifting of the positional relation between ceramic multilayer substrate 203 and laser element 105 will result in a state that differs from the normal oscillation state and laser output can no longer be obtained.

Figure 3:
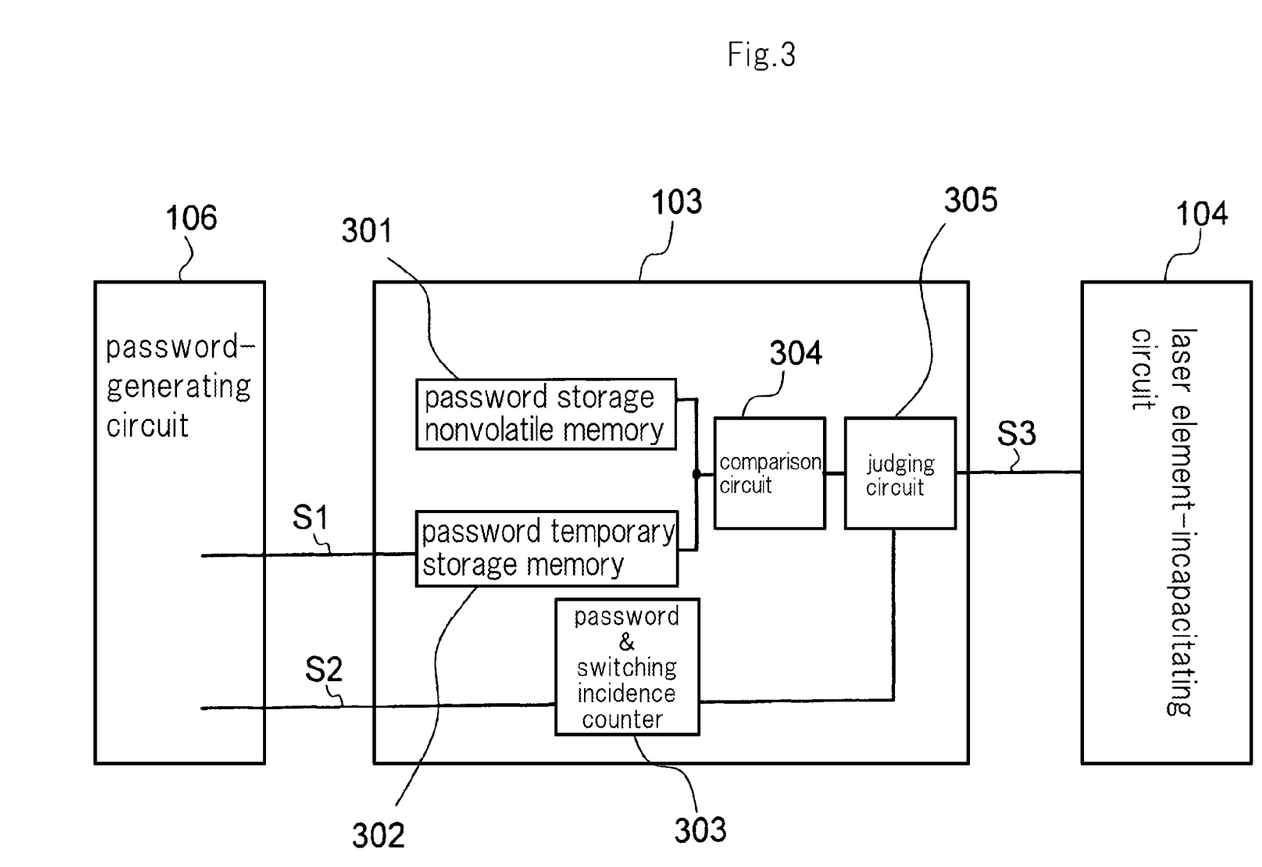
FIG. 3 is a block diagram showing the configuration of password-judging circuit 103.

FIG. 3 is a block diagram showing the configuration of password-judging circuit 103.

Password-judging circuit 103 is made up of: password storage nonvolatile memory 301, password temporary storage memory 302, switching incidence counter 303, comparison circuit 304, and judging circuit 305.

Password storage nonvolatile memory 301 stores a password, the stored password that is stored being set and stored at the time of shipping from the place of manufacture.

When the power supply is applied to laser unit 102, password-generating circuit 106 refers to data that are set in cover password-setting mechanism 107 and connection unit password-setting mechanism 108, generates a password, and supplies the generated password that was generated to password temporary storage memory 302 as password output S1. Password temporary storage memory 302 stores the generated password.

Switch signal S2 is supplied to password & switching incidence counter 303 with each output of password output S2. Password & switching incidence counter 303 increments its count with each output of password output S1, whereby the number of times password output S1 has been supplied can be checked by checking the count value of password & switching incidence counter 303.

Whenever password temporary storage memory 302 stores a generated password, comparison circuit 304 compares the generated password that is stored in password temporary storage memory 302 with the stored password that is stored in password storage nonvolatile memory 301 and supplies to judging circuit 305 a comparison result indicating whether these passwords match.

If the output of comparison circuit 304 indicates that the generated password and stored password match, judging circuit 305 supplies judgment signal S3 to laser element-incapacitating circuit 104 indicating that power is to be supplied to laser element 105. Laser element-incapacitating circuit 104 therefore executes power supply to laser element 105.

On the other hand, if the output of comparison circuit 304 indicates that the generated password and stored password do not match, judging circuit 305 checks the count value of password & switching incidence counter 303 and verifies whether the count value is no greater than a predetermined number, such as three or less. If the count value is no greater than the predetermined number, judging circuit 305 supplies to laser element-incapacitating circuit 104 judgment signal S3 that indicates that power is not to be supplied to laser element 105. Laser element-incapacitating circuit 104 thus does not supply power to laser element 105.

Upon verifying that the output of comparison circuit 304 indicates that the generated password and stored password do not match and that the count value of password & switching incidence counter 303 surpasses the predetermined number, judging circuit 305 supplies to laser element-incapacitating circuit 104 judgment signal S3 that indicates that power supply to laser element 105 is to be incapacitated, whereby laser element-incapacitating circuit 104 executes a process of incapacitating the power supply to laser element 105.

Figure 4:
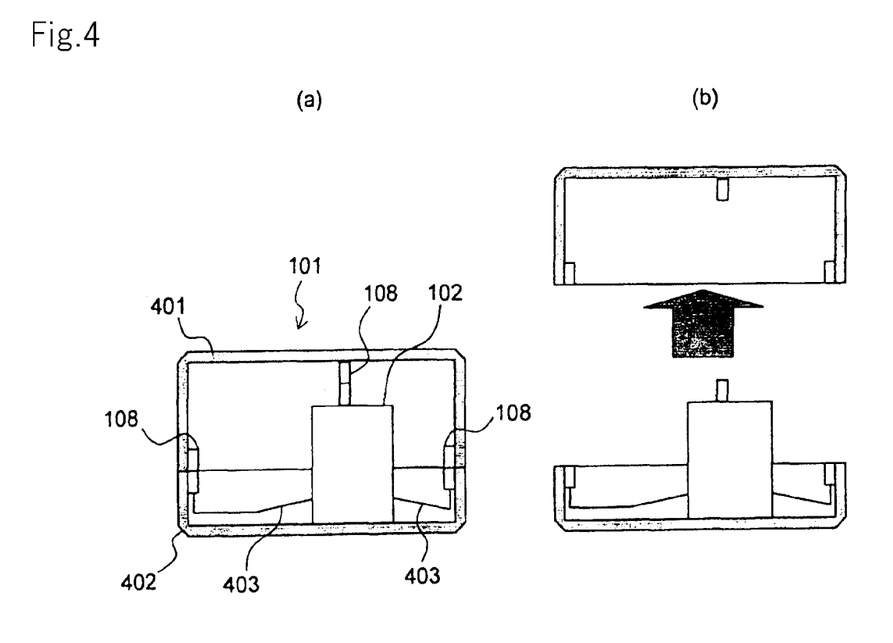
FIG. 4 is a sectional view showing the actual configuration of connection unit password-setting mechanism 108.

FIG. 4 is a sectional view showing the actual configuration of connection unit password-setting mechanism 108. When upper cover 401 and lower cover 402 that make up the case of projector 101 are in a combined state, the contact of a plurality of connection unit password-setting mechanisms 108 that are provided generates data that are sent to laser unit 102 by way of wiring 403.

Figure 5:
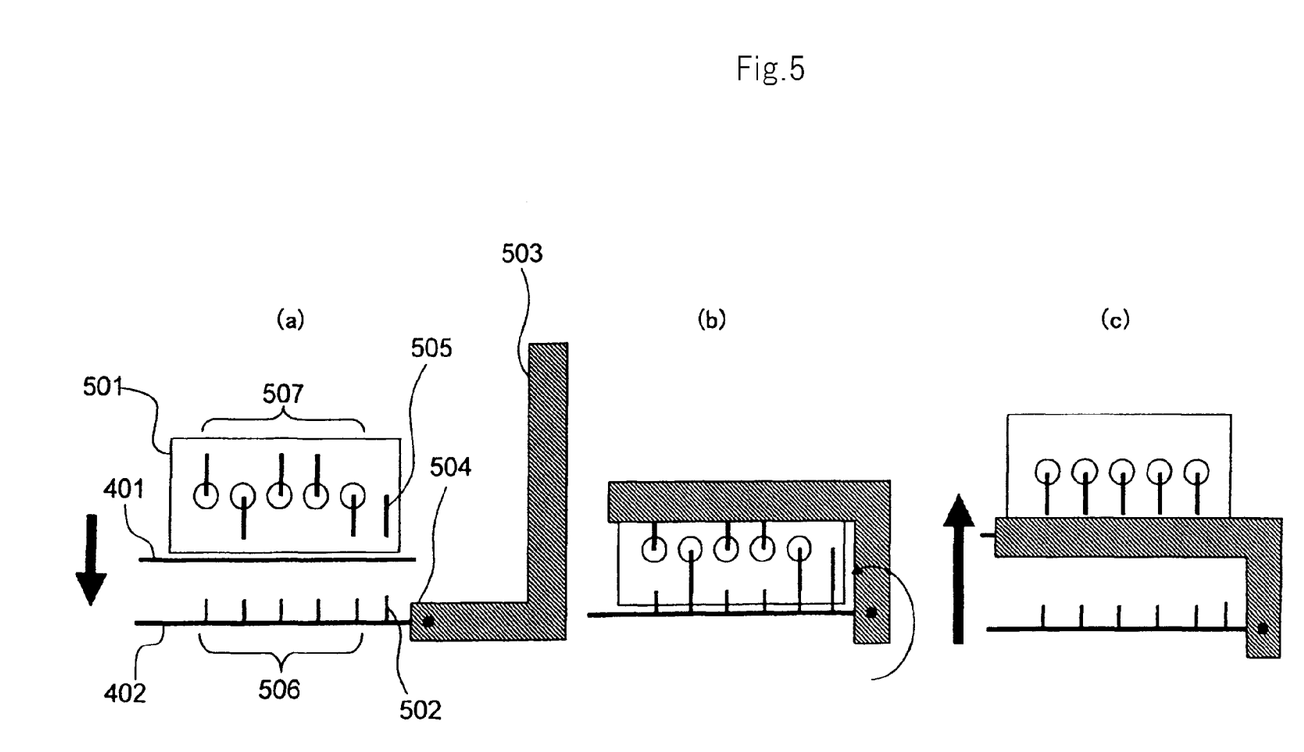
FIG. 5 shows the actual configuration of password-setting mechanism 108.

FIG. 5 shows the actual configuration of password-setting mechanism 108. FIG. 5(a) shows the state before upper cover 401 and lower cover 402 are combined, FIG. 5(b) shows the state in which upper cover 401 and lower cover 402 are combined, and FIG. 5(c) shows the state in which upper cover 401 is opened after upper cover 401 and lower cover 402 have been combined.

Switch 501 in which a plurality of toggle switches 507 are aligned in a row is provided on upper cover 401, and data pins 506 are provided erect on lower cover 402 at positions that correspond to each of toggle switches 507.

In FIG. 5, power supply receiving pin 505 for receiving power supply is formed on the right end of switch 501, and power supply supplying pin 502 is formed on lower cover 402 at a position that corresponds to power supply receiving pin 505.

When upper cover 401 and lower cover 402 are in an assembled state, electrode pin 502 for supplying the power supply is assumed to be always in a connected state. Power supply receiving pin 505 is connected in common to one terminal of each of toggle switches 505.

Wiper 503 in a shape bent at a right angle is axially supported on lower cover 402 to allow rotation around a center in the vicinity of one end. Upper cover 401 is of a dimensional shape that, when combined with lower cover 402, pushes the end of wiper 503, whereby, in the state in which upper cover 401 and lower cover 402 are combined as shown in FIG. 5(b), wiper 503 rotates counter-clockwise and presses the upper ends of toggle switches 507.

As shown in FIG. 5(c), when upper cover 401 is opened and moved upward from the state shown in FIG. 5(b), toggle switches 507, the upper ends of which are pressed by wiper 503, move in the direction of closing and thus assume a state in which each of toggle switches 507 are in the closed state.

Figure 6:
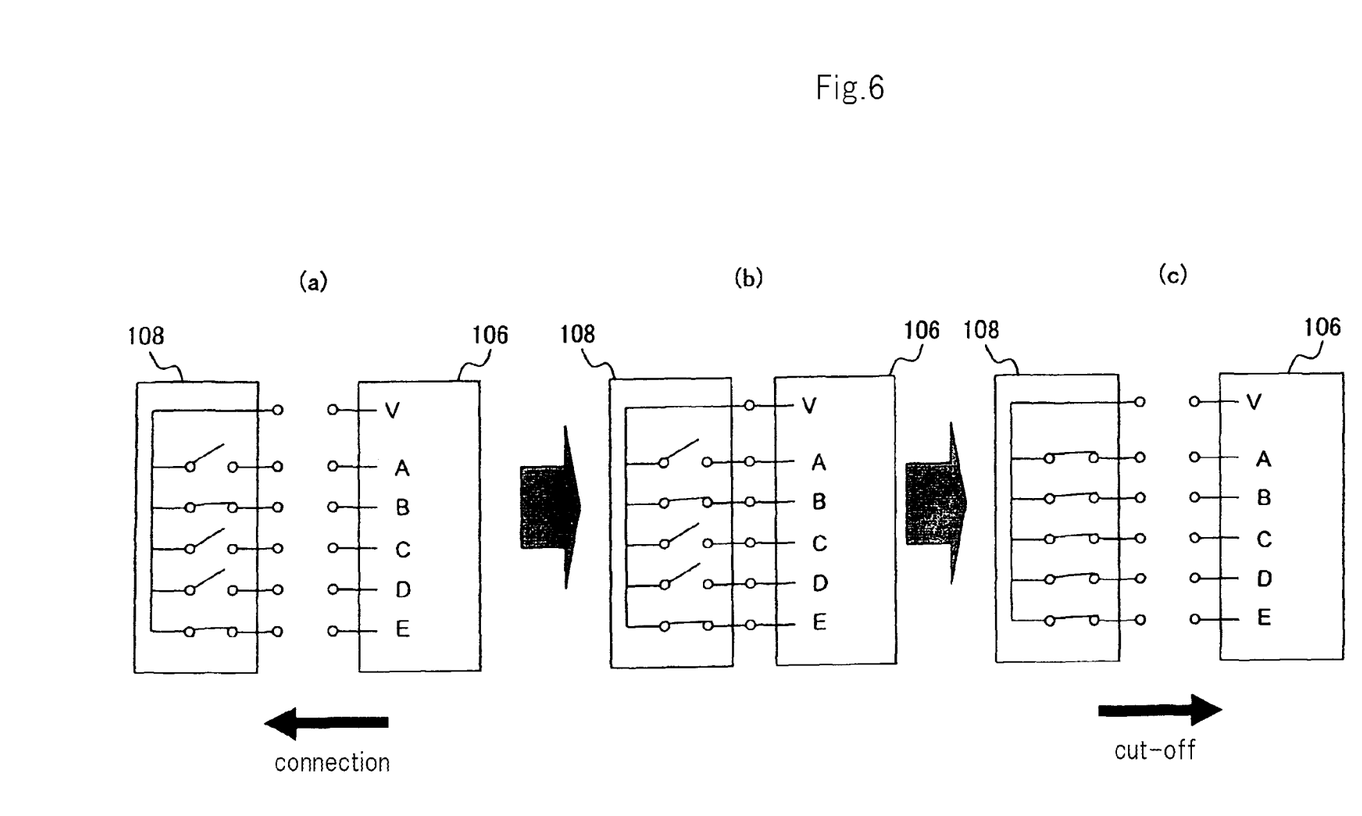
FIG. 6 shows the connected state of connection unit password-setting mechanism 108 and password-generating circuit 106, FIGS. 6(a)-6(c) corresponding to the states of FIGS. 5(a)-5(c), respectively.

FIG. 6 shows the state of connection of unit password-setting mechanism 108 and password-generating circuit 106, and FIGS. 6(a)-6(c) correspond to the states of FIGS. 5(a)-5(c), respectively.

Based on, for example, the instruction manual of the device, the user of the device sets data that are known in connection unit password-setting mechanism 108. During the connection state shown in FIG. 6(b) (when the case is in the normal state), data "01001" are set to input terminals A-E of password-generating circuit 106, and password-generating circuit 106 generates a password based on this input data. Later, when upper cover 401 has been opened, the set state of toggle switches 507 is cleared, and as a result, when in use by a third party that does not know the data that should be set, password-generating circuit 106 is unable to generate the password that matches the generated password that is stored in password temporary storage memory 302 and laser element 105 therefore does not supply output.

Figure 7:
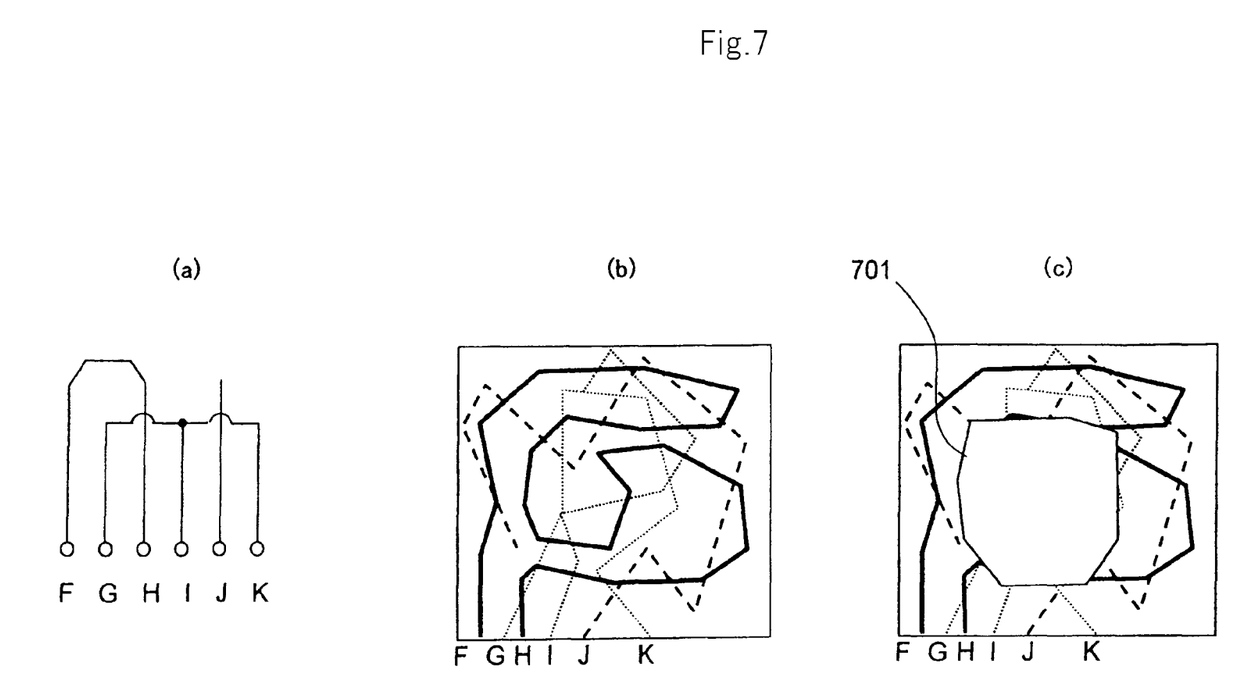
FIG. 7 shows the configuration of cover password-setting mechanism 107.

FIG. 7 shows the configuration of cover password-setting mechanism 107, FIG. 7(a) shows the connection relations of terminals F-K that are set as the password, FIG. 7(b) shows the internal wiring of upper cover 401 or lower cover 402 that realizes the connection relation shown in FIG. 7(a), and FIG. 7(c) shows a state in which upper cover 401 or lower cover 402 has been cut away.

In the connection relation in which terminals F and H and terminals G, I, and K are connected as shown in FIG. 7(a) (when the case is in the normal state), when viewed with terminal F as a standard, the data indicated by terminals G-K are "01000". When viewed with terminal G as the standard, the data indicated by terminals F and H-K are "00101".

The terminal that is to be taken as a standard when viewing the data of each terminal is determined in advance in password-generating circuit 106, and password-generating circuit 106 reads the legitimate data from each terminal that is connected when upper cover 401 or lower cover 402 is in the installed state and generates a password based on the data that were read.

When gap 701 in which upper cover 401 or lower cover 402 has been cut away is formed as shown in FIG. 7(c), the connection relation shown in FIG. 7(a) cannot be verified, and password-generating circuit 106 cannot read the legitimate data. As a result, in a state in which upper cover 401 or lower cover 402 has been cut away, password-generating circuit 106 is unable to generate a password that matches the generated password that is stored in password temporary storage memory 302, and laser element 105 therefore does not produce output.

Figure 8:
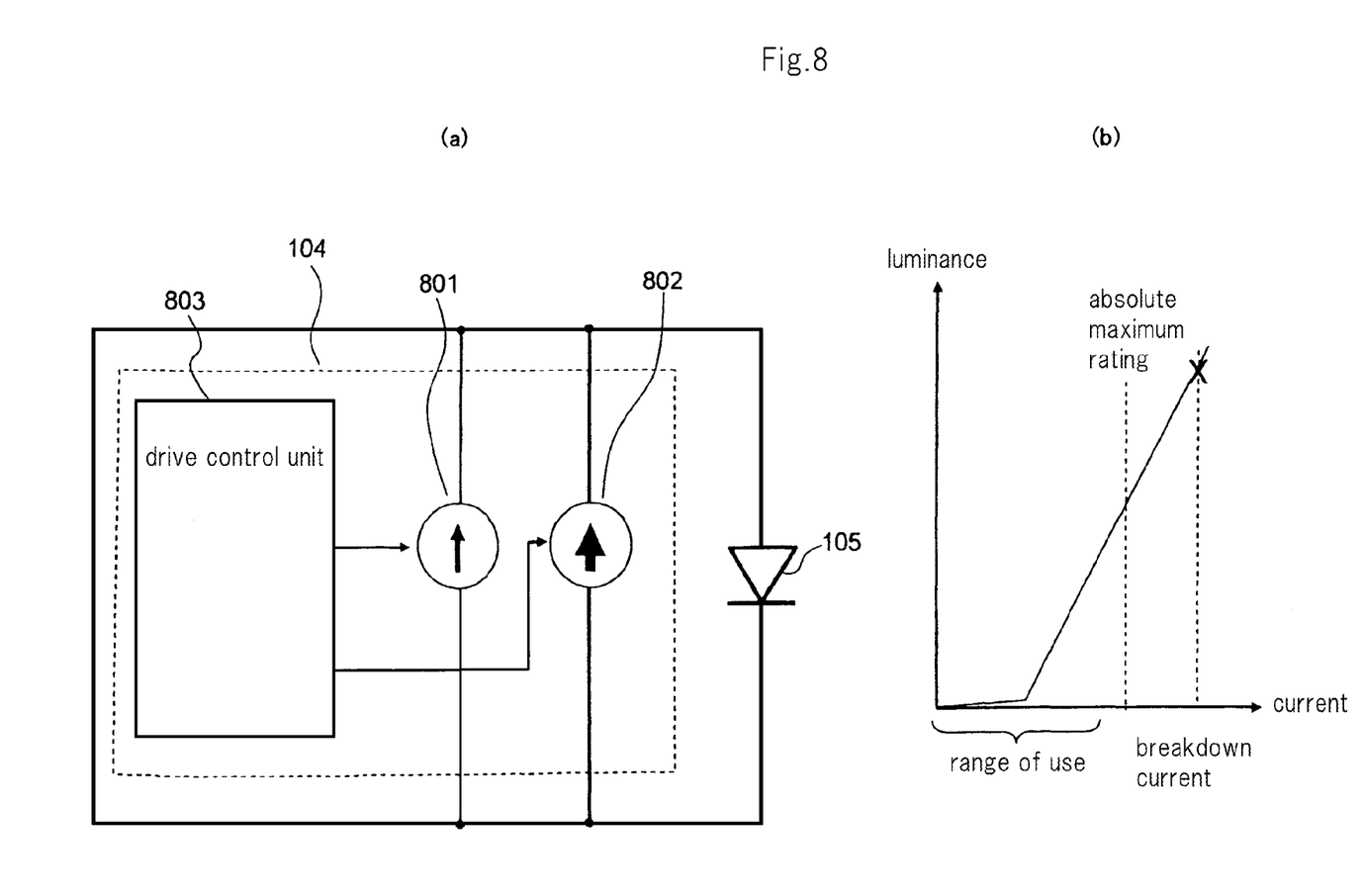
FIG. 8(a) is a block diagram showing the configuration of an exemplary embodiment of laser element-incapacitating circuit 104.
FIG. 8(b) shows the current-luminance characteristic of a laser element.

FIG. 8(a) is a block diagram showing the configuration of an exemplary embodiment of laser element-incapacitating circuit 104.

Laser element-incapacitating circuit 104 in the present exemplary embodiment is made up of: normal-use current source 801 that supplies current to laser element 105, laser element breakdown-use current source 802, and drive control unit 803 that instructs current to be supplied by means of normal-use current source 801 or laser element breakdown-use current source 802 according to the content of judgment signal S3.

As shown by the current-luminance characteristic of FIG. 8(b), the luminance of a laser element is determined according to the current value when the current is equal to or greater than a particular value, but when the current becomes a breakdown current that exceeds an absolute maximum rating, the element breaks down.

Upon receiving from judging circuit 305 judgment signal S3 that indicates that power is to be supplied to laser element 105 (see FIG. 3), drive control unit 803 causes current to be supplied by normal-use current source 801 that supplies current that is no greater than the absolute maximum rating, but upon receiving from judging circuit 305 judgment signal S3 that indicates that power supply to laser element 105 is to be incapacitated, drive control unit 803 causes current to be supplied by laser element breakdown-use current source 802 that supplies a breakdown current and thus destroys laser element 105.

Figure 9:
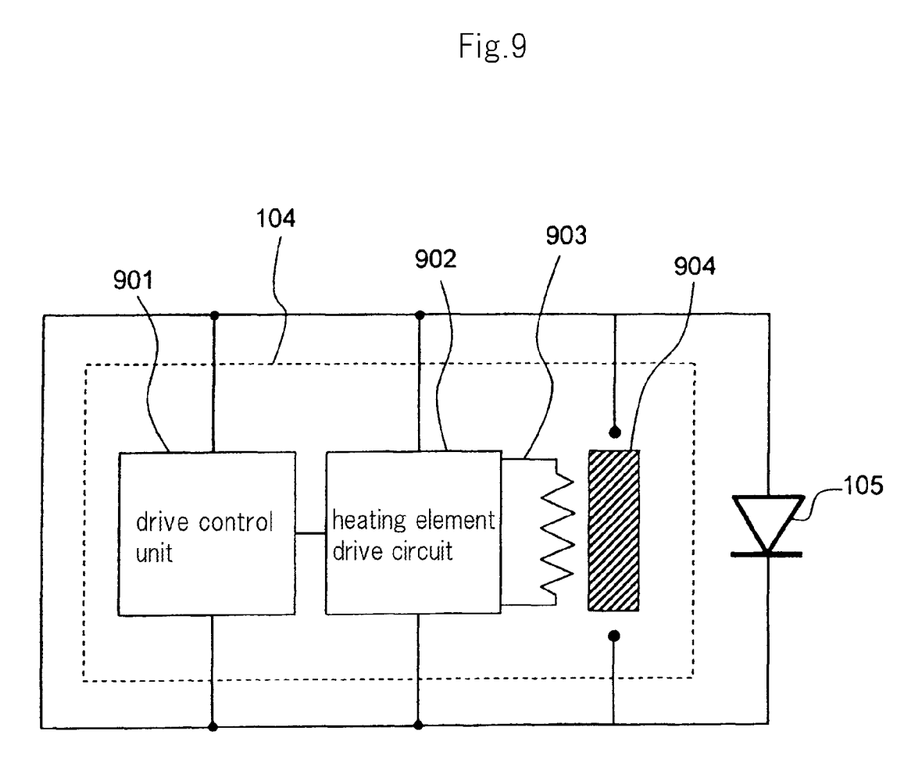
FIG. 9 is a block diagram showing the configuration of another exemplary embodiment of laser element-incapacitating circuit 104.

FIG. 9 is a block diagram showing the configuration of another exemplary embodiment of laser element-incapacitating circuit 104.

Laser element-incapacitating circuit 104 in this exemplary embodiment is made up of: heating element drive circuit 902 that is provided in parallel with laser element 105, electrical conduction material 904, drive control unit 901 that causes heating element drive circuit 902 to operate according to judgment signal S3, and heating element 903 that produces heat by the drive current realized by heating element drive circuit 902 to heat electrical conduction material 904.

Upon receiving from judging circuit 305 judgment signal S3 that indicates that the power supply to laser element 105 is to be incapacitated, drive control unit 901 causes heating element drive circuit 902 to operate and thus heat heating element 903. As a result, electrical conduction material 904 is heated and melts, causing the two terminals of laser element 105 to short-circuit and cut off the flow of current.

Figure 10:
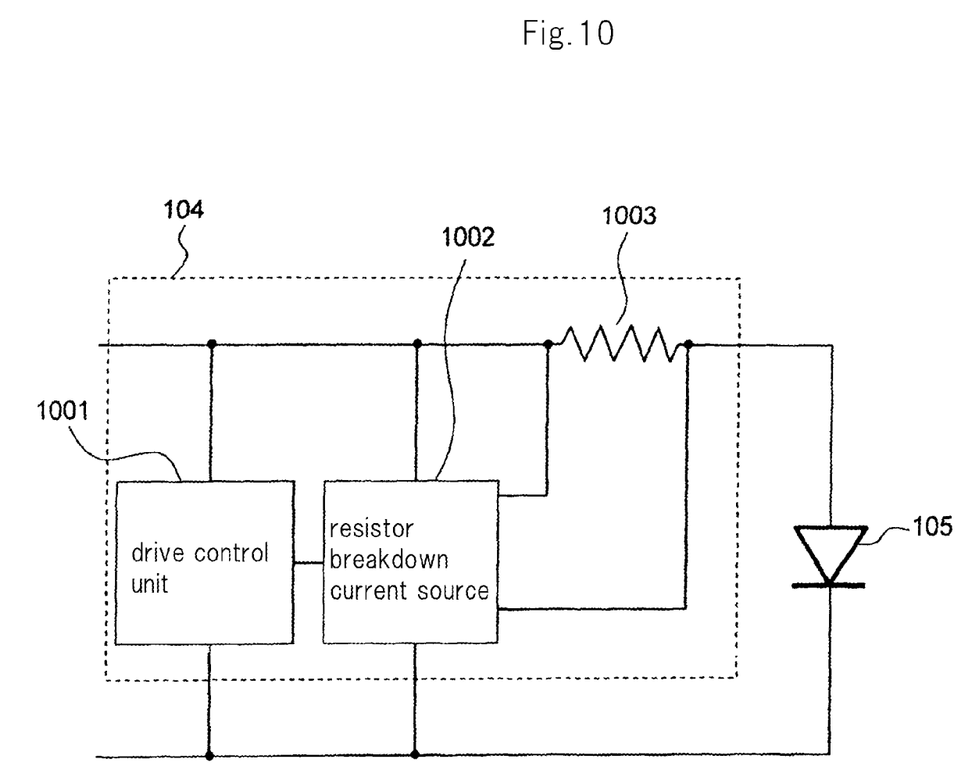
FIG. 10 is a block diagram showing the configuration of another exemplary embodiment of laser element-incapacitating circuit 104.

FIG. 10 is a block diagram showing the configuration of another exemplary embodiment of laser element-incapacitating circuit 104.

Laser element-incapacitating circuit 104 in the present exemplary embodiment is made up from: resistance element 1003 provided on the current supply path to laser element 105, resistor breakdown current source 1002 that is connected to both ends of resistance element 1003 and that is capable of supplying current only to resistance element 1003, and drive control unit 1001 that controls the operations that are performed on resistor breakdown current source 1002.

Drive control unit 1001, upon receiving from judging circuit 305 judgment signal S3 that indicates that power supply to laser element 105 is to be incapacitated, causes resistor breakdown current source 1002 to operate to heat and burn out resistance element 1003. In this way, current no longer flows to laser element 105.

This application claims the benefits of priority based on Japanese Patent Application No. 2010-165991 for which application was submitted on Jul. 23, 2010 and incorporates by citation all of the disclosures of that application.

EXPLANATION OF REFERENCE NUMBERS 101 projector
102 laser unit
103 password-judging circuit
104 laser element-incapacitating circuit
105 laser element
106 password-generating circuit
107 cover password-setting mechanism
108 connection unit password-setting mechanism
201 substrate
202 cover
203 ceramic multilayer substrate
204 collimator lens
301 password storage nonvolatile memory
302 password temporary storage memory
303 password & switching incidence counter
304 comparison circuit
305 judging circuit

What is claimed is:

1. A laser light source module that is used installed in a case, comprising:
    a laser unit that is provided with a memory unit that stores a password and that operates when an input password that is entered as input matches with a password that is stored in said memory unit;
    password-setting mechanisms that generate different data according to the state of said case; and
    a password-generating circuit that, when said case is in a normal state, generates, by means of data that were generated by said password-setting mechanisms, an input password that matches the password that is stored in said memory unit.

2. The laser light source module as set forth in claim 1, wherein:
    said case is formed by combining a plurality of parts;
    said password-setting mechanisms are provided with:
    cover password-setting mechanisms that constitute a part of said case in which wiring that connects a plurality of terminals is implemented; and
    connection unit password-setting mechanisms that are provided at connection sites when the plurality of parts that form said case are combined and that further are capable of setting a predetermined data string, the data string that is set being reset when the assembly is taken apart; and said password-generating circuit generates said input password based on the connection state of the plurality of wiring that is indicated by said cover password-setting mechanisms and the data string that is indicated by the connection unit password-setting mechanisms.

3. The laser light source module as set forth in claim 1 or claim 2, wherein said laser unit is provided with:
a laser element that supplies laser light;
a laser element-incapacitating circuit that is capable of incapacitating said laser element; and
a password-judging circuit that is provided with said memory unit and that, when an input password from said password-generating circuit does not match with a password that is stored in said memory unit more for than a predetermined number of times, incapacitates said laser element by means of said laser element-incapacitating circuit.

* * * * *